(12) United States Patent
Eastwood et al.

(10) Patent No.: US 12,307,172 B2
(45) Date of Patent: May 20, 2025

(54) SYSTEMS AND METHODS FOR COMPUTER AIDED DESIGN ANALYSIS

(71) Applicant: aPriori Technologies Inc., Concord, MA (US)

(72) Inventors: Cormac Eastwood, Antrim (GB); Jonathan Wilson, Armagh (GB); Amanda Bligh, Boston, MA (US); Gibson Peters, Weymouth, MA (US)

(73) Assignee: APRIORI TECHNOLOGIES INC., Concord, MA (US)

( * ) Notice: Subject to any disclaimer, the term of this patent is extended or adjusted under 35 U.S.C. 154(b) by 0 days.

(21) Appl. No.: 18/426,930

(22) Filed: Jan. 30, 2024

(65) Prior Publication Data

US 2024/0256728 A1    Aug. 1, 2024

Related U.S. Application Data

(60) Provisional application No. 63/442,275, filed on Jan. 31, 2023.

(51) Int. Cl.
*G06F 30/17* (2020.01)
*G06F 30/00* (2020.01)

(52) U.S. Cl.
CPC ............ *G06F 30/17* (2020.01); *G06F 30/00* (2020.01)

(58) Field of Classification Search
USPC ........................................................... 703/7
See application file for complete search history.

(56) References Cited

U.S. PATENT DOCUMENTS

| | | |
|---|---|---|
| 12,131,271 B2 | 10/2024 | Shukla et al. |
| 2008/0249756 A1 | 10/2008 | Chaisuparasmikul |
| 2013/0090894 A1* | 4/2013 | Dikerman .............. G06Q 30/00 703/1 |
| 2013/0325410 A1 | 12/2013 | Jung et al. |
| 2020/0184125 A1* | 6/2020 | Machalica ............. G06F 30/12 |
| 2021/0190641 A1 | 6/2021 | Oostendorp et al. |
| 2022/0214668 A1* | 7/2022 | King ...................... G06F 30/20 |
| 2023/0054705 A1* | 2/2023 | Ramamurthy ....... G06Q 10/103 |
| 2024/0095416 A1* | 3/2024 | Brudy ................... G06Q 50/04 |

FOREIGN PATENT DOCUMENTS

WO    2019180466 A1    9/2019

OTHER PUBLICATIONS

Mohebbi et al., The Role of Embodied Carbon Databases in the Accuracy of Life Cycle Assessment (LCA) Calculations for the Embodied Carbon of Buildings, Sustainability, available at https://doi.org/10.3390/su13147988 (Jul. 16, 2021).*

International Search Report and Written Opinion dated May 8, 2024 with was issued in connection with PCT/US2024/013491.

* cited by examiner

*Primary Examiner* — William L Bashore
*Assistant Examiner* — Conrad R Pack
(74) *Attorney, Agent, or Firm* — Buckley, Maschoff & Talwalkar LLC

(57) ABSTRACT

Pursuant to some embodiments, systems, methods and computer program code are provided for analyzing the embodiment carbon associated with the manufacture of a part.

18 Claims, 14 Drawing Sheets

| Production Scenario 310 | Tolerance 330 | Process & Machine Options 340 | Cost 350 | Sustainability 370 |
|---|---|---|---|---|

| | |
|---|---|
| Part Number | HEAT SINK |
| Scenario | Initial |
| Description | - |
| Revision | - |
| Process Group | Casting - Die |
| Digital Factory | aPriori China |
| Material | Aluminum, ANSI AL380.0 |
| | |
| Batch Size | 458 |
| Annual Volume | 5,500 |
| Production Life | 5 |
| Total Planned Volume | 27,500 |
| | |
| Cost Target (USD) | 0 |
| Amount Variance (USD) | 0 |
| Percent Variance | 0 |
| Total Projected Cost Difference (USD) | 0 |
| Fully Burdened Cost (USD) | 1.77 |
| | |
| Sustainability | |
| Total Carbon (kg CO2e) | 0.63 |

| | |
|---|---|
| Rough Mass (kg) | 0.07 |
| Finish Mass (kg) | 0.06 |
| Material Utilization | 96% |
| Material Unit Cost (USD / kg) | 1.86 |

| | |
|---|---|
| Date costed | Jan 18, 2023 |
| Costed by | Gibson Peters |
| Currency | USD |
| Unit System | Metric |

FIG. 3C

| | 310 | | 330 | | 340 | | 350 | | 370 |
|---|---|---|---|---|---|---|---|---|---|
| Production Scenario | | Tolerance | | Process & Machine Options | | Cost | | Sustainability | |

| Carbon Summary | Material Carbon | Manufacturing Carbon |
|---|---|---|

Use the section below to explore alternative materials and their impact on carbon and cost. If a Different material is selected, the part will be automatically recosted after clicking OK.

Current Material

| Name | Carbon (kg CO2e) | Carbon Emissions Factor (kg CO2e/kg) | Density (kg m^3) | Cost/Volume (USD / cm^3) |
|---|---|---|---|---|
| Steel, AISI 4140, Medium-Carbon | 84.57 | 2.07 | 7,830 | 0.0055 |

Material Type: Steel

Other Materials

| Name | Carbon (kg CO2e) | Carbon Emissions Factor (kg CO2e/kg) | Density (kg m^3) | Cost/Volume (USD / cm^3) |
|---|---|---|---|---|
| Steel, AISI 4140, Medium-Carbon | 84.57 | 2.07 | 7,830 | 0.0055 |
| Steel, Cold Worked, AISI 1005 | 101.49 | 2.46 | 7,900 | 0.0119 |
| Steel, Cold Worked, AISI 1008 | 100.85 | 2.46 | 7,850 | 0.0118 |
| Steel, Cold Worked, AISI 1010 | 100.85 | 2.46 | 7,850 | 0.0118 |
| Steel, Cold Worked, AISI 1012 | 100.85 | 2.46 | 7,850 | 0.0118 |
| Steel, Cold Worked, AISI 1018 | 101.49 | 2.46 | 7,850 | 0.0123 |
| Steel, Cold Worked, AISI 4130 | 100.2 | 2.46 | 7,800 | 0.0128 |

FIG. 31

SYSTEMS AND METHODS FOR COMPUTER AIDED DESIGN ANALYSIS

RELATED APPLICATIONS

This application claims benefit of and priority to U.S. Provisional Patent Application Ser. No. 63/443,375 filed on Jan. 31, 2023, the contents of which are hereby incorporated by reference in their entirety for all purposes.

BACKGROUND

Manufacturers are increasingly concerned with the environmental impact of their products and processes. This is in part due to the passage of sustainability regulations in many countries which require manufacturers and brands to reduce their carbon footprints. Further, many consumers are willing to pay a premium for environmentally friendly products.

Unfortunately, it is difficult for manufacturers to evaluate a product's carbon footprint during design and planning phases. The manufacture of each part of a product impacts the environment in a number of ways. The material selected, the choice of process, and even the location of the factory are each variables that influence the amount of carbon dioxide equivalent ("$CO_2e$") that is associated with the part (referred to herein as "embodied carbon"). The evaluation of each of these variables can be highly complex and are made even more complex when analyzed in conjunction with an evaluation of the cost of manufacturing a part. It would be desirable to provide systems and methods allowing manufacturers to simulate the projected cost and quantity of embodied carbon and to evaluate how changes in material selection, design, manufacturing process and manufacturing location can impact those costs and quantity of embodied carbon.

BRIEF DESCRIPTION OF THE DRAWINGS

Features and advantages of the example embodiments, and the manner in which the same are accomplished, will become more readily apparent with reference to the following detailed description taken in conjunction with the accompanying drawings.

FIGS. 3A-3I are diagrams illustrating user interfaces pursuant to some embodiments.

Figure 1:
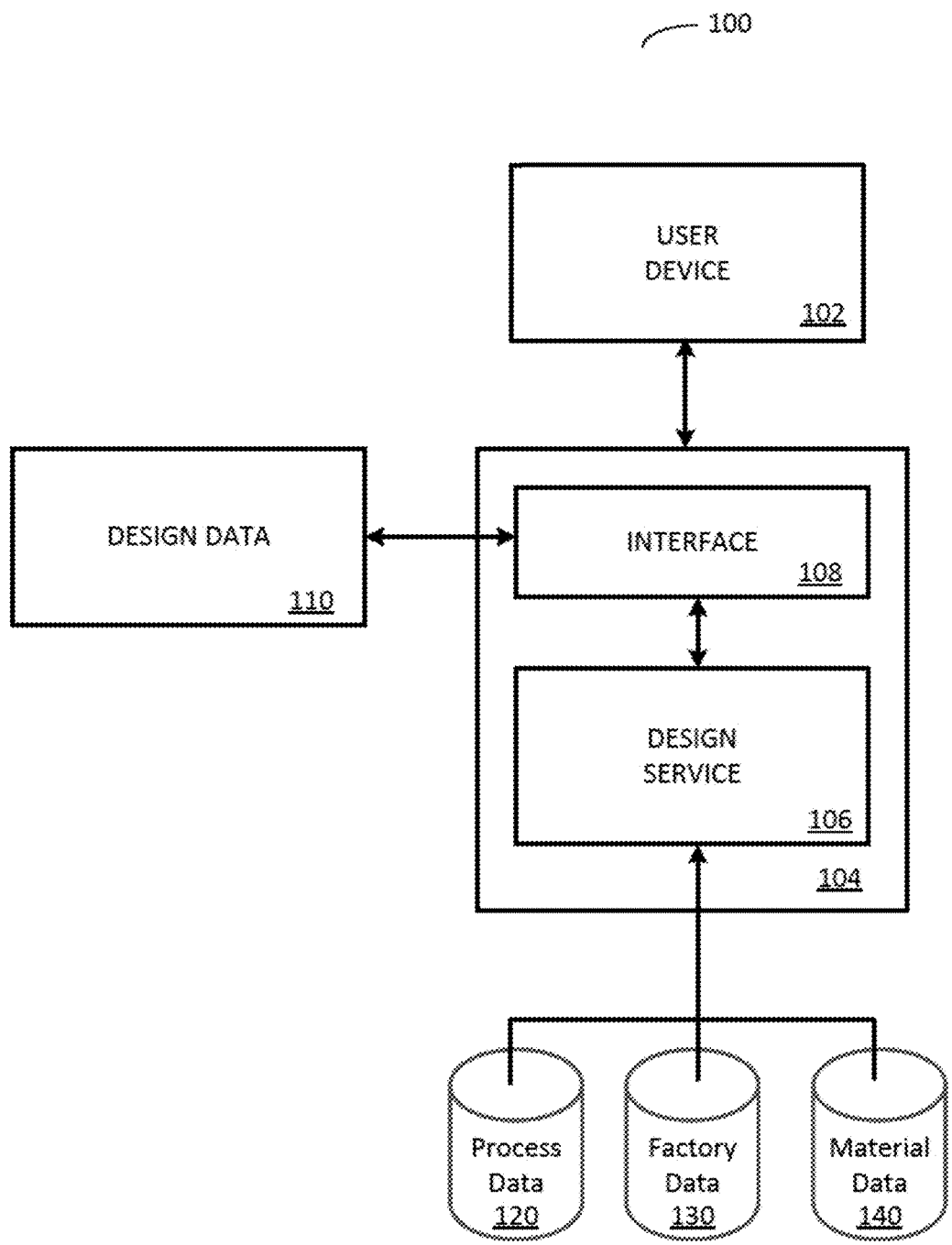
FIG. 1 is a diagram illustrating a design system pursuant to some embodiments.

Throughout the drawings and the detailed description, unless otherwise described, the same drawing reference numerals will be understood to refer to the same elements, features, and structures. The relative size and depiction of these elements may be exaggerated or adjusted for clarity, illustration, and/or convenience.

DETAILED DESCRIPTION

In the following description, specific details are set forth in order to provide a thorough understanding of the various example embodiments. It should be appreciated that various modifications to the embodiments will be readily apparent to those skilled in the art, and the generic principles defined herein may be applied to other embodiments and applications without departing from the spirit and scope of the disclosure. Moreover, in the following description, numerous details are set forth for the purpose of explanation. However, one of ordinary skill in the art should understand that embodiments may be practiced without the use of these specific details. In other instances, well-known structures and processes are not shown or described in order not to obscure the description with unnecessary detail. Thus, the present disclosure is not intended to be limited to the embodiments shown, but is to be accorded the widest scope consistent with the principles and features disclosed herein.

A designer of a part to be manufactured is often unaware of factors that can impact the embodied carbon associated with the manufacture of the part. It is increasingly important for businesses to consider the carbon footprint of their product's manufacture. Unfortunately, comparing processes, materials and manufacturing location (all of which influence the environmental impact of manufacturing a part) is complex and difficult. For example, it is difficult to calculate embodied carbon from the material that is used to manufacture a part. To calculate the rough mass needed to manufacture a part, a user needs to understand the manufacturing process to be used as well as the stock material needed to manufacture the part. Rough mass (also referred to herein as "raw mass") can vary by the manufacturing process used and is difficult to calculate correctly. For example, a finished machined part can be as little as 5-20% of the initial rough mass of the materials used while the finished mass of a part that is formed by casting may be around 95% of the rough mass. Further, the manufacturing process may use different steps or "routings". As an example, a die casting manufacturing process may include routings to perform machining, milling, cutting, or drilling. Each of these routings influences the embodied carbon of the manufacture of the part. Each routing may use a different machine, and also impact the cycle time of the part manufacture. Each machine may have different energy consumption requirements. All of these variables influence the embodied carbon of a manufacturing process making it highly complex and technical to determine the embodied carbon of manufacturing a part.

Pursuant to some embodiments, systems, methods and computer program code are provided for analyzing the embodied carbon associated with the manufacture of a part. Embodiments allow the embodied carbon to efficiently be calculated for different manufacturing processes, in different geographical locations and for different materials, allowing users to analyze different scenarios and combinations of variables. Embodiments provide systems and methods for designing for sustainability which allow users to easily determine the embodied carbon of different design choices, processes, materials and manufacturing locations, thereby allowing sustainable choices to be made. Further, embodiments allow such embodied carbon analyses to be performed in conjunction with cost analyses, allowing users to compare the cost and embodied carbon of different scenarios. Embodiments provide a technical improvement to the technology of parts design and analysis, providing improved systems, methods and computer program code to analyze part designs.

Pursuant to some embodiments, a part designer or other user can interact with a system of the present invention to compare a number of different part manufacture scenarios to identify a desirable combination of cost and embodied carbon. These different scenarios are highly complex and involve the analysis of four primary variables (each of which include a number of data points and sub-variables). The four primary variables are the geometry and shape of the part, the material(s) used in the manufacture of the part, the process(es) used in the manufacture of the part and the specific location(s) of the factory(s) selected to manufacture the component. Pursuant to some embodiments, the system of the present invention may output cost and embodied carbon information to a user via a user interface which allows the user to select a combination of the four primary variables that results in a desired balance of cost and embodied carbon.

For convenience and ease of exposition, a number of terms are used herein. For example, the term "process" or "process type" is generally referred to the type of manufacturing process to be used to manufacturer a part (or, using embodiments of the present invention, to analyze a part for potential manufacture using one or more process types). For example, different process types may include die casting, injection molding, machining or sheet metal bending or manipulation (although those skilled in the art will appreciate that other process types may also be used to manufacturer a part and that these process types are used as examples herein). Embodiments allow users to compare the costs associated with manufacturing a part using different process types as well as to compare the embodied carbon of manufacturing the part using different process types.

As used herein, the term "cycle time" generally refers to the amount of time that one or more machines are operated in order to produce a part using a given process type. Different process types involve different cycle time calculations. For example, a part to be made using a machining process type may have a complex cycle time that includes the sum of the cut time for each operational step in the machining process. The cycle time may also include operational time of multiple process routings using different machines. Further details of the calculation of different cycle times will be provided below.

As used herein, the term "material" when used to refer to a part to be manufactured refers to the raw material(s) used in the manufacture. For example, different types of materials include different types of plastics (e.g., for injection molding) or different types of metals (e.g., for machining, sheet metal or different types of casting).

A second, although lesser impact on embodied carbon in the manufacture of a part is the embodied carbon associated with the manufacturing process itself (the "process carbon" or "process embodied carbon"). As discussed further below, the process carbon depends in part on the factory location chosen. The factory location determines the "grid mix" associated with that factory (and the associated processes). As used herein, the term "grid mix" refers to information associated with the mix of power sources used for a factory operating in a given geographical location. For example, the "grid mix" of a factory in one location may be primarily comprised of electricity generated by coal fired plants, while the "grid mix" of a factory in another geographical location may include electricity generated by renewable energy sources. The different "grid mix" associated with the use of different factories is used by the present invention to determine the overall embodied carbon in the process.

Prior to providing a detailed description of features of the present invention, an illustrative (but not limiting) example will be described. In the illustrative example, a company wishes to manufacture a part for a piece of equipment. The part is a heat sink which will eventually be mounted on another part to dissipate heat. The company has a set of computer-aided design (CAD) drawings of the heat sink that define the dimensions and shape of the heat sink. The CAD drawings include a model stored in a file that includes a rendering/visualization of the heat sink (such as the visualization shown as part 306 of FIG. 3B). In addition to the structural design (or geometric shape) of the heat sink, the CAD file may include additional attributes that are stored within metadata of the CAD file itself or within a parts object that is paired with the CAD file. The company now wishes to select a manufacturer to make the heat sink pursuant to the requirements specified in the CAD file.

The company knows the specifications that the heat sink needs to meet (they are defined in the CAD files), but is able to consider different manufacturing process, geographic locations of manufacturers, and materials in order to manufacture the part in a cost-effective manner while reducing the embodied carbon associated with manufacturing the part.

The company wishes to keep the cost of manufacturing down (so that the machine that incorporates the heat sink may be sold at a reasonable profit). In addition, the company wishes the manufacture of the heat sink to be sustainable—to reduce the amount of embodied carbon emissions caused by the manufacture of the heat sink. Embodiments allow the company to import or otherwise provide the design described in the CAD file to a design system for analysis. The design system of the present invention allows the company (or a user or representative of the company) to interact with the design system to analyze different scenarios to arrive at a manufacturing approach which achieves a desired balance of cost and embodied carbon. The different viable outcomes can include scenarios with different materials, different manufacturing processes, and different locations of manufacturing facilities. By interacting with the design system to adjust these different variables, the company can arrive at a manufacturing approach which achieves the desired balance of cost and embodied carbon. The selected approach can then be communicated to a manufacturer to initiate manufacture of the part. This illustrative example will be referenced below in conjunction with various figures to describe features of the present invention.

Reference is first made to FIG. 1 which is a block diagram illustrating various components of a system of the present invention. FIG. 1 depicts a system 100 which includes a design system 104 which analyzes aspects of a part to be manufactured by receiving a computer aided design ("CAD") model. The CAD model may be provided in the form of one or more files provided by a user operating a user device 102 in communication with the design system 104 and uploaded or otherwise transmitted to a design service 106 via an interface 108. The design service 106 may include a number of rules and computer program code configured to analyze the CAD model and perform processing as described further herein. The CAD model may also be provided in the form of one or more files retrieved via interface 108 from a design data repository 110. For example, the design data repository 110 may be a product lifecycle management (PLM) system. For example, many part designers or other companies use PLM systems to manage CAD files. In some embodiments, the interface 108 of the design system 104 may be configured to interface or otherwise receive data from different PLM systems (e.g., to translate or convert the data from the PLM system into data that may be manipulated by the design system 104). Although a single user device 102, design data repository 110 and design system 104 are shown in FIG. 1, those skilled in the art will appreciate that in practical application, multiple user devices, design data repositories and/or design systems may be provided. For example, multiple user devices 102 and multiple design data repositories 110 may provide part design data to the design system 104 for analysis as described further herein.

The information from each CAD model (or data from design data repository 110) define one or more parts to be manufactured. After ingesting this data, the design system 104 is configured to perform analyses of different aspect of a part, the part materials, manufacturing processes, and manufacturer locations to generate estimates of the embodied carbon of a number of different manufacturing options for the part as well as to generate manufacturing cost estimates for each of the different manufacturing options. The design system 104 may be operated on a local computing device or a remote, hosted device (or network of computing devices).

The design service 106, upon receiving the design data from the interface 108, performs operations to identify one or more geometric features of interest of the part and recommend modifications to the one or more geometric features to improve the design for manufacturability as well as cost and embodied carbon. For example, the design service 106 can make recommendations to reduce the number of tools needed, to change a specialized tooling process to a more standard process, reduce an amount of manufacturing time, reduce manufacturing cost, reduce the raw materials needed for the part, change the geographic location of where the part is manufactured to affect cost or embodied carbon due to local labor rates and electricity grid mixes, etc.

The design service 106 may present information to a user via one or more user interfaces. The user interfaces may allow the user to change one or more manufacturing variables to see their impact on cost and embodied carbon. Pursuant to some embodiments, a user may run different "scenarios" with different variables, and then compare the results of those different scenarios to arrive at a desired balance of cost and embodied carbon.

Pursuant to some embodiments, the design system 104 performs a variety of different analyses associated with the manufacture of a part using data associated with different manufacturing processes (e.g., such an analysis of die casting the part versus machining the part). In part, these analyses may use data associated with different manufacturing processes received from one or more databases such as a process database 120. The design system 104 may also perform analyses associated with estimating cycle times for the manufacture of the part using data from one or more databases such as a factory database 130. For example, the cycle times associated with manufacturing a part may differ based on the materials or processes used to manufacture the part and each of those different cycles may consume differing amounts of electricity. The design system 104 may also perform analyses associated with estimating the amount of embodied carbon associated with different materials that may be used for the manufacture of the part using data from one or more databases such as material database 140. While the term "database" is used to refer to databases 120-140, those skilled in the art, upon reading the present disclosure, will recognize that data may be stored in or obtained from other types of information sources or data storage devices. For example, the data may be obtained from an application programming interface as a file or feed.

Pursuant to some embodiments, the process database 120 may include data associated with different processes. Each manufacturing process may include, for example: numerous process feasibility checks on each process required to manufacture the part (e.g., minimum bend radius, maximum thickness, material type, achievable tolerances and consumables required by the process), modifications to cycle time based on the material type selected (e.g., adjustment factors to cutting rates based on the material cut code), and the power requirements for each stage of a process cycle time. In some embodiments, the process database 120 consists of a number of lookup tables to retrieve this information by process type.

Pursuant to some embodiments, the factory database 130 may include regionalized facility data for a large number of geographical regions. For example, the factory database 130 may include economic and machine related data associated with factories in different regions. including: data to determine facility overhead rates (e.g., electricity rate, gas rate, rent rate, insurance factors and additional support allocations), machine parameters to conduct feasibility assessments and determine machine overhead rates (e.g., machine cost, size, lifespan and maintenance factors), further machine parameters facilitate determination of the process cycle time (e.g., machine spindle power, traverse speed and tool replacement time), industrial sector labor rates by skill level and electricity embodied carbon factor for the specific facility or geographical region.

Pursuant to some embodiments, the material database 140 may contain detailed material information for hundreds of different material compositions including data for a number of different stock types, hundreds of individual stock sizes and their associated processes. This data may include: material property data to conduct feasibility assessments (e.g., material type, specific heat capacity and material hardness), material cost data for each material and for the specific stock type (when required) to manufacture the part, and material embodied carbon factors for each material.

The design system 104 may generate one or more analyses and/or recommendations allowing a user to choose a desired manufacturing approach to manufacture a part (including, for example, recommendations about which process(es) to use, what geographical locations the part should be manufactured in, and what material(s) should be used). In some embodiments, the recommendations may be generated in conjunction with other manufacturing recommendations to allow improved cost, efficiency and sustainability.

Figure 2A:
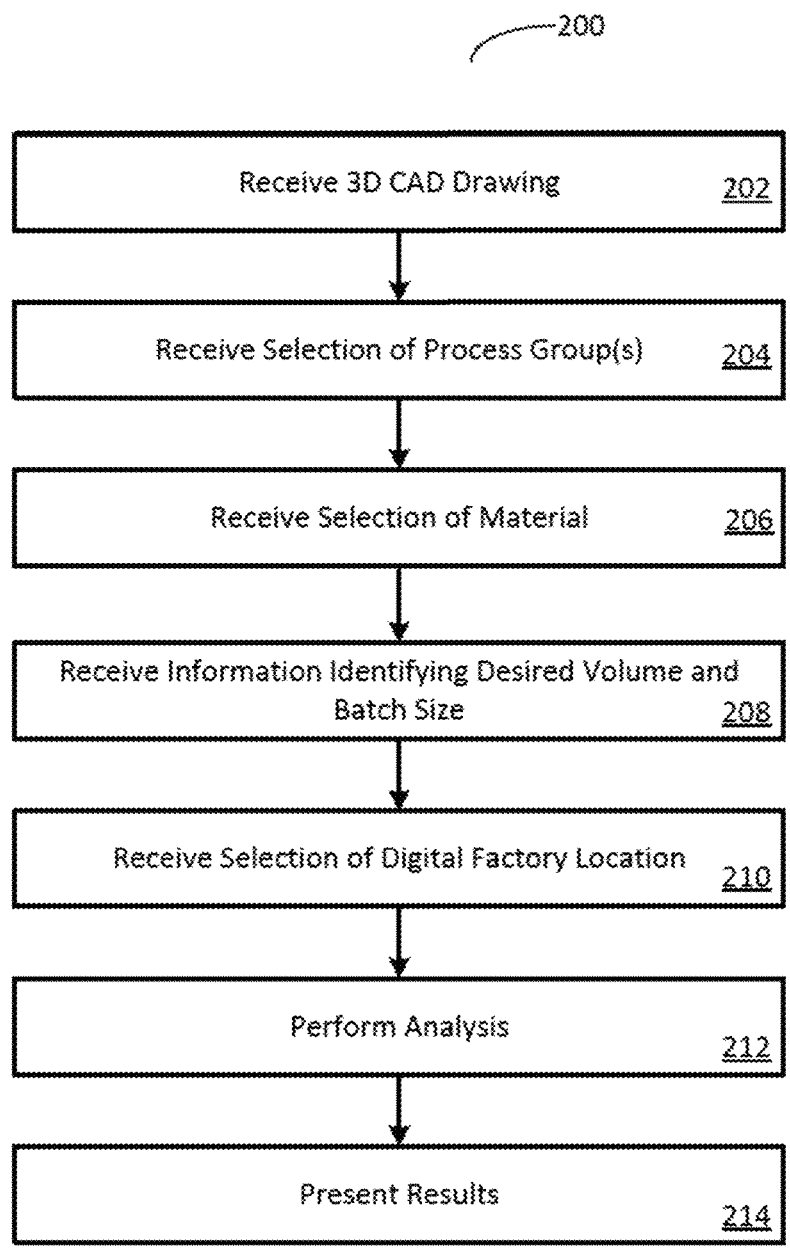
FIGS. 2A-2C are diagrams illustrating processes pursuant to some embodiments.
Figure 2B:
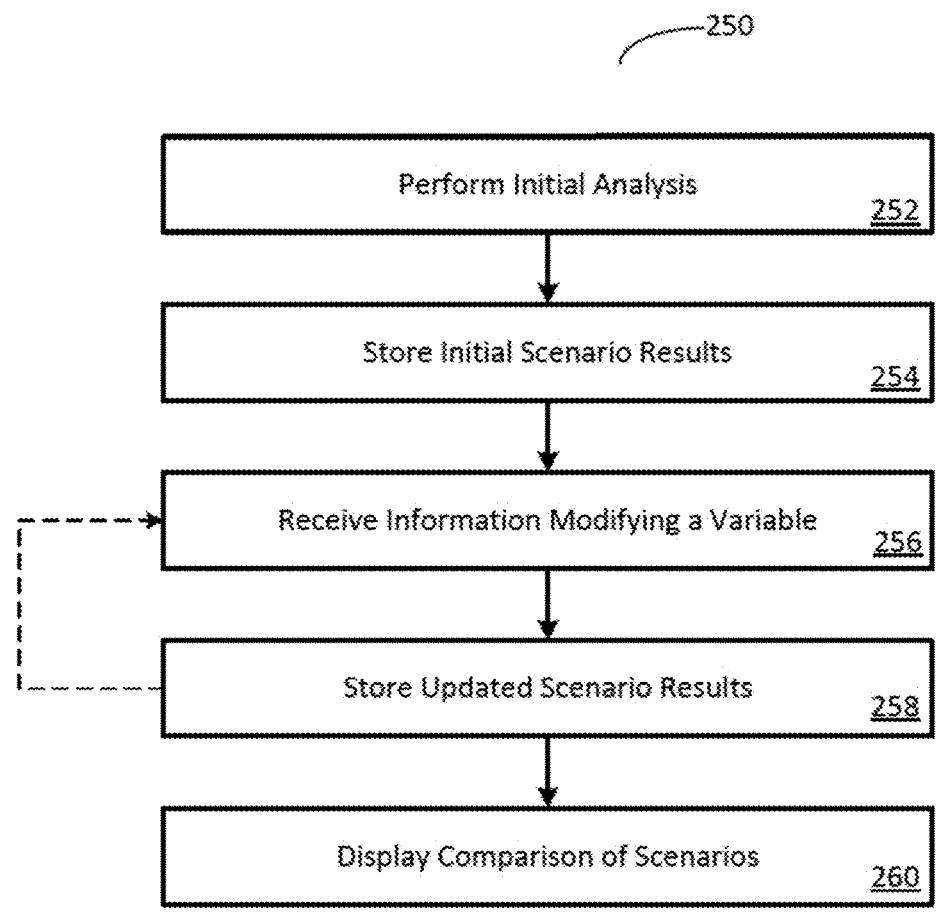
Figure 2C:
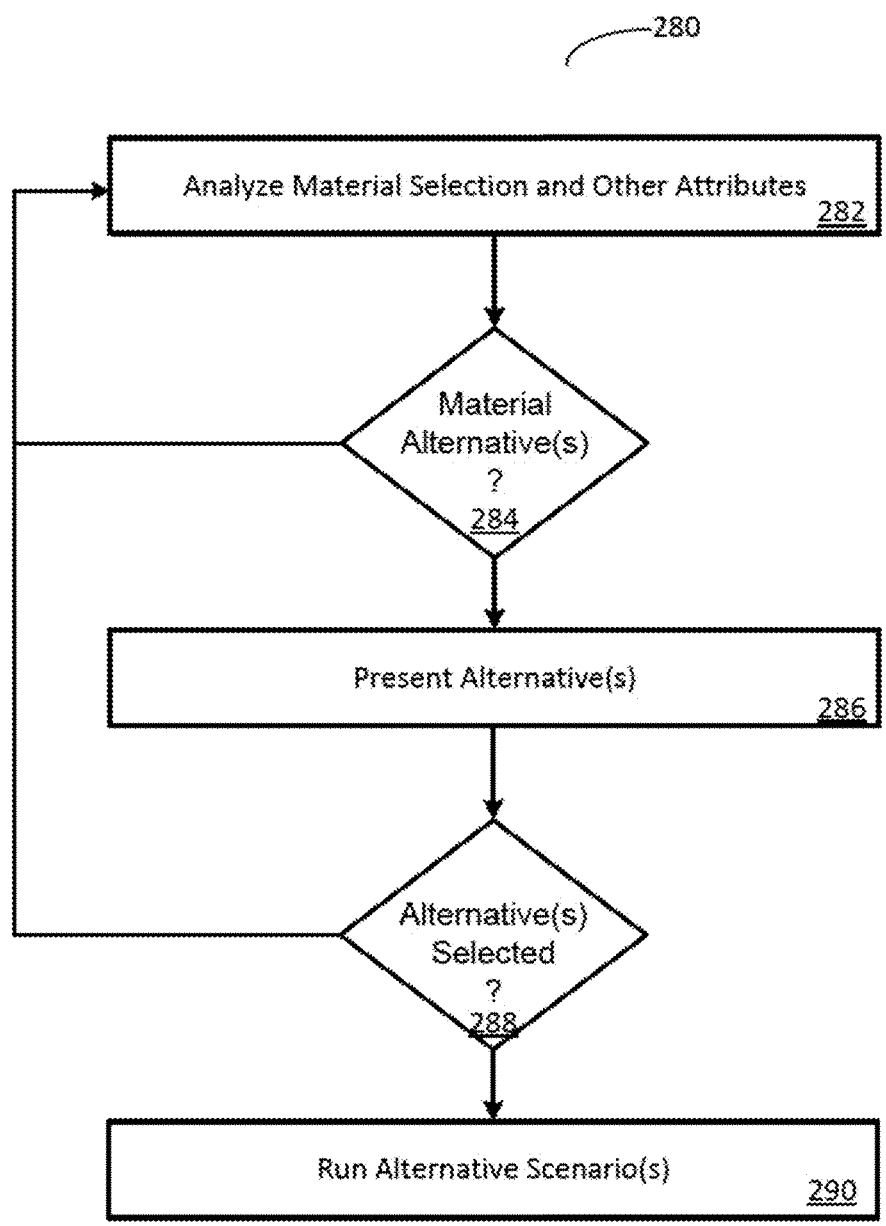

FIGS. 2A-2C illustrate processes 200, 250, 280 that may be performed by the design system 104 (in conjunction with other components of system 100) pursuant to some embodiments. The processes 200, 250, 280 of FIGS. 2A-2C will be described in conjunction with various user interface figures shown in FIGS. 3A-3I. The user interfaces of FIGS. 3A-3I are for illustrative purposes only, and those skilled in the art, upon reading the present disclosure, will appreciate that other user interface configurations may also be used to interact with the system of the present invention. The user interfaces of FIGS. 3A-3I may be, for example, accessed by a web browser of a user device 102 for display on a display of the user device 102 and may be configured to receive inputs from a user operating the user device 102 (e.g., via a keyboard, cursor, mouse, touch screen, or other input devices associated with the user device 102).

Figure 3A:
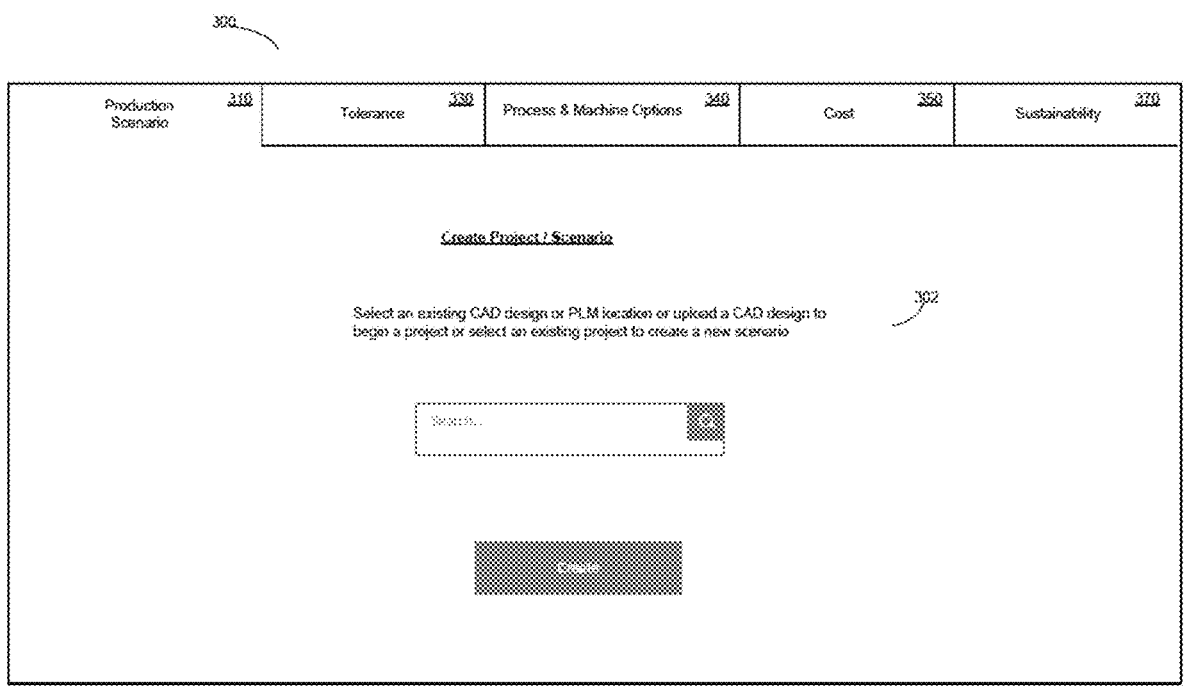

The process 200 may be initiated, for example, at the request of a user operating a user device 102. For example, the user may be a manufacturing engineer or other designer who wishes to evaluate aspects of a part to be manufactured to identify whether the part (or components thereof) may be manufactured in a more sustainable manner. Processing begins at 202 where one or more CAD files or part objects are provided to the design system. For example, a user operating user device 102 may interact with a user interface such as the user interface 302 of FIG. 3A. The user interface 302 (and the user interfaces shown in FIGS. 3B-3I) may for example, be displayed on a display device 300 of a user device 102. As shown in FIG. 3A, a user may be prompted to upload a CAD model (e.g., in one or more CAD files), select an existing (previously uploaded) CAD model, identify a location of a CAD model in a location (such as a PLM location in a design data repository 110, etc.). In some embodiments, a user may also be able to select an existing project (e.g., involving a previously uploaded or identified CAD model that has previously been analyzed to create one or more embodied carbon and cost scenarios). As used herein, the term "scenario" will be used to refer to data associated with a part that has been analyzed by the system of the present invention using a number of input variables selected by a user). The term "project" will be used to refer to data associated with a part that has been analyzed by the system of the present invention in one or more "scenarios" (where each scenario may have different input variables selected by the user).

On receipt of the CAD files, the design system 104 may perform processing to analyze the part design. Processing continues at 204 where the design system 104 prompts the user (via a user interface displayed for the user on a display screen of the user device 102) to provide a selection of one or more process group(s) to be used in the manufacture of the part. In general, a "process group" as used herein is a collection of manufacturing processes that share a common understanding of feature recognition and material form. For example, a user may be prompted to choose whether an analysis should be performed if the part were to be manufactured using a die casting process or a machining process. In some embodiments, the types of process groups that are available to be selected are ascertained by the design system 104 upon initial analysis of the CAD files, thereby ensuring that a user is not able to select a process group that is incompatible with the part design.

Figure 3B:
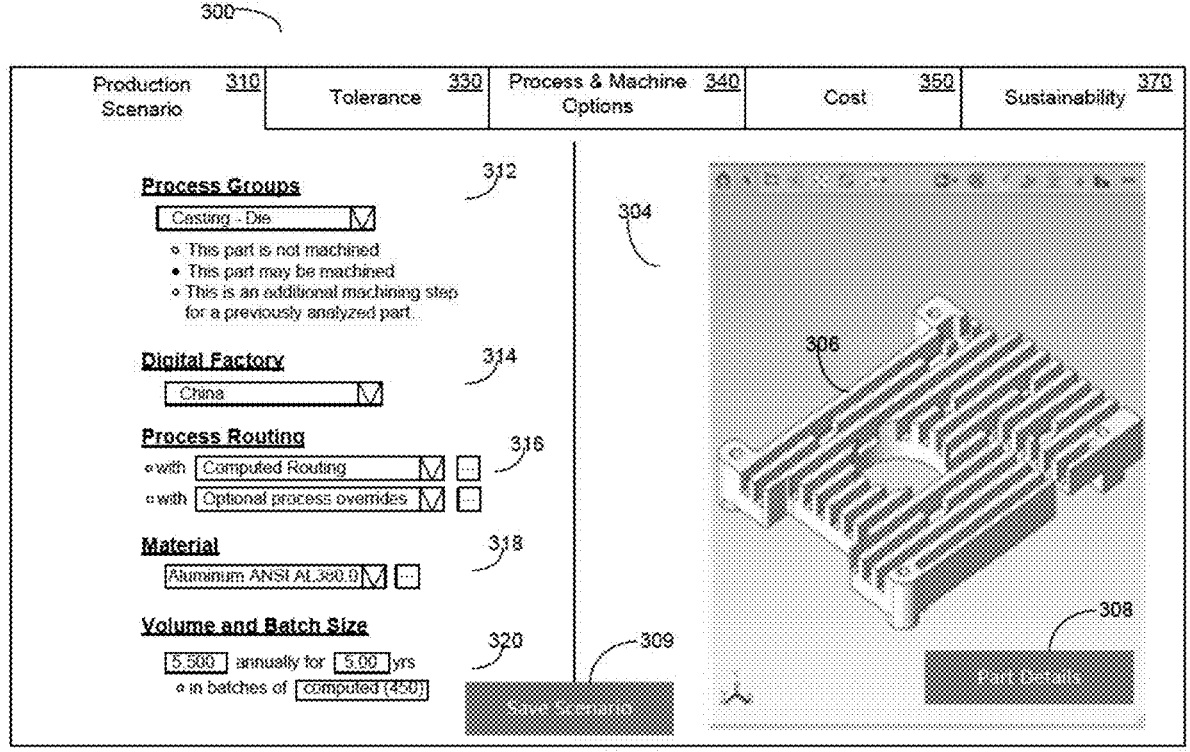

An example of a user interface that allows a user to select one or more process groups (and other input variables) is shown in FIG. 3B. As shown in FIG. 3B, a display 300 displays a number of menu options available for selection by a user, including a production scenario menu group 310, a tolerance menu group 330, a process & machine options menu group 340, a cost menu group 350, and a sustainability menu group 370. These menu groups are provided for illustrative purposes only, and those skilled in the art, upon reading this disclosure, will appreciate that other groups or groupings may also be used. When the production scenario menu group 310 is selected (as shown in FIG. 3B), a number of input options are presented to a user (shown on the left hand side of the display 300 as items 312, 314, 316, 318, 320) as well as a visualization area 304 displaying a rendering of the part 306. The rendering of the part 306 is generated by the design system 104 based on the CAD files uploaded at 202. In some embodiments, the visualization area 304 includes a number of controls that allow a user to interact with the rendering of the part 306 (e.g., to zoom, pan, rotate or otherwise inspect the part).

Processing at 204 may include the user interacting with the display 300 to select a process group at 312. In the illustrative example, the heat sink is compatible with die casting, and die casting is presented to the user as a process group option (and has been selected by the user in FIG. 3B). Some die cast parts require machining processing as well, and this has been selected by the user in the example of FIG. 3B. In some embodiments, the display 300 of FIG. 3B is created based at least in part on an analysis of the CAD model by the design system 104 and by retrieval of process data from process database 120. For example, this processing may include determining whether a part is compatible with a given manufacturing process and, if so, including that process as an option available for selection by the user at 312. Pursuant to some embodiments, the compatibility of the part with a process is determined based on a feasibility evaluation by the design system 104. In some embodiments, user permissions may also determine whether a user is able to select from among certain compatible manufacturing processes (e.g., the system may impose license restrictions based on whether the user has a license to a manufacturing process).

Once the user has selected desired process group(s) attributes, processing continues at 206 where the design system 104 receives a selection of a raw material type (at input 318) to be used in the manufacture of the part. In some embodiments, multiple options may be selected, and the same part may be analyzed to determine the embodied carbon of producing the same part using different types of a material. For example, if a part is to be manufactured using Nylon, embodiments allow a user to select from a list of types of Nylon (e.g., using NylonType 6 (30% glass)), and other types of Nylon compatible with the process group(s). In the illustrative example, the user selects to analyze the manufacture of the heat sink using Aluminum (more particularly, Aluminum ANSI AL380.0). In some embodiments, the input at 318 allows the user to select from a calculated list of compatible materials. The calculated list of compatible materials is determined by the design system 104 based on analysis of the CAD model as well as based on the selected process groups (e.g., based on the input received from the user at 312). This ensures that the user is not presented with material options that are incompatible with the design or the selected process.

Once these selections have been made, processing may continue at 208 where the user provides other relevant information (e.g., such as the quantity of parts to be manufactured in the different scenarios, the size of each run or batch, etc.). This information is used by the design system 104 to compute embodied carbon as well as cost.

Once the user has selected a desired process group(s), a selection of material, information identifying desired volume and batch size, processing continues at 210 where the design system 104 prompts the user to provide a selection of a factory location in which the part (using the process group(s) selected at 204) is to be manufactured. Pursuant to some embodiments, the selected factory location may be a "digital" or "virtual" location which will be simulated by the design system 104 using a digital twin or digital model of a factory in the corresponding geographical location. Pursuant to some embodiments, the selection of the digital factory location causes the design system 104 to use different sustainability parameters. For example, the selection of a digital factory location causes the design system 104 to retrieve factory data from a factory database 130 that include local electricity costs as well as estimates of regional $CO_2$ emissions (e.g., represented as kg $CO_2$/kWh). As an illustrative example, if the digital factory location is selected in China, the $CO_2$ emissions may be equal to approximately 1.02 kg $CO_2$/kWh, whereas a digital factory location in the United States may have $CO_2$ emissions equal to approximately 0.5 kg $CO_2$/kWh. In some embodiments, the estimates are based on the current electricity mix in the region (e.g., Coal, Natural Gas, Nuclear, Hydro or renewables). The selection of the digital factory location may have impacts on other estimates made by the design system 104 as well.

Referring again to the illustrative display 300 of FIG. 3B, the user may be presented with a drop-down menu to select a desired digital factory 314. The options available to the user may vary based on the process group(s) selected at 312 as well as other information associated with the CAD model based on analysis by the design system 104. For example, certain processes and designs may not be compatible with certain factory locations.

Once the user has selected a desired factory location, processing continues at 212 where the design system 104 receives information identifying one or more process routing attributes. Different parts with different manufacturing processes may involve different process routings (essentially sub-steps of a selected manufacturing process). For example, a part (such as the heat sink in the illustrative example) may be die cast (as selected at step 204 and as selected at 312 in FIG. 3B). However, based on the design of the part, a number of process routings may be required to finish the part. These process routings may be determined by the design system 104 (based on the selected process and the CAD model) and are referred to herein as a "computed routing". They may also include one or more preconfigured "process override(s)" which may modify one or more routings or sub-steps. In general, as used herein, a process override is a user-provided deviation from the design systems 104 default assumption. Referring again to the illustrative example, while the primary process selected for the heat sink is "Casting-Die", the design system 104 may determine that there are several sub-processes or routings required.

Examples of routings include a collection of processes used in a manufacturing process (for example, a routing may include one or more of stock machining, perimeter cutting, 3-Axis milling, sawing, or bulk milling processes). These routings may be needed to resize the raw material to a size appropriate for the die casting. The selection of process routings has a direct influence on both the embodied carbon of the process as well as the cost of the part. For example, if a part requires many process routing steps, it is likely that additional energy will be expended (thereby increasing the process embodied carbon). Further, if the raw material requires substantial machining or other cutting to reduce the size of the material, there may be additional waste (increasing the cost as well as the embodied carbon). Embodiments allow these variables to easily be analyzed using the system of the present invention. Pursuant to some embodiments, the options available to a user (at 316 of FIG. 3B, for example) are determined by the design system 104 based on the CAD model and the selected process groups (at 312 of FIG. 3B). Routing data may be retrieved by the design system 104 from process data 120.

With these selections and additional information provided, processing continues at 212 where the design system 104 is operated to perform the analyses. In some embodiments, the analyses are performed for each combination of selections. In general, processing at 212 includes determining the material embodied carbon as well as the process embodied carbon (the sum of which is the total embodied carbon of the scenario). Pursuant to some embodiments, processing at 212 further includes determining the cost of each scenario (e.g., which is generally equal to the cost of the materials, the tooling and setup costs, the manufacturing process costs, the assembly cost as well as the labor cost for each scenario). The determination of each of these values may be an iterative process involving process data from process database 120, factory data from factory database 130 and material data from material database 140.

Pursuant to some embodiments, embodiments perform a determination of the rough mass required for manufacture of a part in a given scenario. This determination involves a number of factors and is influenced by the selected process group, processing routing and material. The determination of the rough mass will now be described for various process groups. If the part is selected to be manufactured using injection molding, the determination of the part's rough mass is based on a determination of the part's "finish mass" divided by the "utilization". The "utilization" is computed as: utilization=(1−material waste factor)*mold efficiency, where the efficiency is based on the machine to be used (retrieved from process data 120 and factory data 130) (and which is typically equal to 0.95). The material waste factor is expressed as a percentage and is the difference between a "runner factor" and a "regrind allowance". The regrind allowance may default to 0.25 and may also be retrieved from the factory data 130 or input as a user specified value. The runner factor is a function of the runner volume, the number of cavities of the part, and the part volume. The number of cavities of the part and the part volume are computed by the design system 104 based on the CAD model of the part. In injection molding, a "runner" is a channel cut into the mold that allows the material (such as plastic) to flow from the nozzle to the cavity (the mold). The "runner volume" is computed by the design system 104 based on the CAD model of the part as well as information about the machine to be used (retrieved from process data 120 and factory data 130). The part "finish mass" is determined based on the "part volume" multiplied by the "material density". The part volume is determined by the design system 104 based on the CAD model of the part and the material density of the selected material (input at step 206). The material density may be retrieved from material database 140. In this manner, embodiments allow the efficient and accurate calculation of the rough mass of an injection molded part.

If, in a scenario, the part to be manufactured is selected to use a machining process, the selection of the proper material stock is a primary driver for calculating the rough mass (and therefore the determination of the embodied carbon of the scenario). Analysis at 212 include processing to ensure that proper material stock is selected and analyzed. This includes processing to determine appropriate material stock alignment and cross-section. Embodiments automatically determine the most likely stock form and alignment direction. The design system 104 analyzes the geometry of the part (from the CAD model) and evaluates potential stock axis directions and cross sections from these directions. In some embodiments, a user may be able to view the selected stock axis directions and cross sections by interacting with the visualization area 304 in display 300 (e.g., as shown in FIG. 3B). In some embodiments, a user may override the stock form and alignment recommended by the design system 104. The design system 104 uses a number of rules to determine the stock form and alignment for a part. For example, if the part is round, a round cross-section may be assigned (allowing the selection of round stock material). If the part is generally flat and round, the part may be assigned a rectangular cross-section (and plate stock may be selected for use in the analysis). The rules applied by the design system 104 may determine that plate stock may be used based on the machines and factory selected. For example, a selected factory or machine may have a maximum value for accepting round stock and/or a maximum value for the thickness of the stock compared to the round-cross section diameter. These parameters dictate what stock material may be used at a given factory or machine (and may be retrieved, for example, from factory data 130). The choice of appropriate input stock material for a selected factory/machine in a scenario can have a large influence on the embodied carbon of producing a part. Another factor is the stock machining material size and allowances.

In some embodiments, the design system 104 uses a concept of a machining stock allowance when determining the initial stock size required to machine a given part. A stock allowance is a small amount of extra material added to the finished part dimensions to accommodate any machining (material removal) needed to meet material quality, tolerance or finish requirements. The stock allowance may be specified in a CAD model of the part and is analyzed by the design system 104. A non-zero stock allowance may be required to drive rough- and finish-machining of the part. A zero-value stock allowance means that the "as-supplied" stock surfaces are sufficient for the finished part, with no additional machining required to achieve desired quality, tolerances or surface finish requirements. The design system 104 determines the ideal stock size required for a part based on the dimensions of the finished part, and the amount of material required to meet any specified stock allowances (both of which are determined from the CAD model of the part). In some embodiments, when the design system 104 determines that non-hex stock is appropriate for a part, the design system 104 selects stock with the smallest standard thickness greater than or equal to the ideal thickness. This selection includes data from material data 140.

In some embodiments, a concept of "virtual" stock may also be used in situations where actual stock is not available. The use of the concept of "virtual" stock allows analysis to be performed to see if a stock may be appropriate for the part, even if that stock is not currently available. In some embodiments, the design system 104 uses rules to apply default stock allowances. These rules may determine a minimum and a maximum stock allowance. In some embodiments a percentage stock allowance may be applied in situations where the stock material is a rectangular bar, a square bar, or plate. The percentage stock allowance may be a percentage of the part cross-sections height. In situations where the stock material is a round bar or round tube, the percentage stock allowance is a percentage of the part cross-section's outside diameter. Other rules may also be applied by the design system 104 to determine a part's stock allowance.

If, in a scenario, the part to be manufactured is selected to use sheet metal processing at 212 includes analysis specific to that material and associated manufacturing processes. For example, the material cost of a sheet metal part is based on the rough mass required to make the part. The utilization of the raw material is equal to the finish mass of the part divided by the rough mass (where "rough mass" includes any material scrap). The design system 104 uses a number of methods to determine sheet metal material utilization. These methods may be based on the process to be used to fabricate the part using sheet metal. For example, if the scenario indicates that sheet metal is the material to be used, and the selected manufacturing process is progressive die, the design system 104 may use a true part shape nesting (TPSN) algorithm to determine material utilization. This algorithm maximizes material utilization and minimizes waste by finding the tightest nesting for parts using a blank's actual perimeter (where the blank perimeter is determined from the process data 120 and factory data 130). In a progressive die process, the TPSN algorithm uses an optimized strip-nesting algorithm in which parts are nested in rows and all parts in a row have consistent orientations. If, in a scenario, the material is sheet metal and the process is another type of hard-tool routing (other than progressive die), the design system 104 may use a rectangular nesting by default. This approach considers length-wise and width-wise orientations of the material using the blank's smallest enclosing rectangle (determined from process data 120 and factory data 130).

Pursuant to some embodiments, a user may be allowed to specify a desired approach for calculating utilization of a sheet metal fabricated part. For example, a user may be able to select "rectangular nesting", "true-part nesting", "machine default nesting" or an "override". In some embodiments, the design system 104 may permit the user to select "rectangular nesting" if the part is rectangularly nested on a sheet, with either a length-wise or width-wise orientation. The design system 104 may permit the user to select "true-part nesting" if the selected manufacturing process is progressive die. In this nesting, the part's actual perimeter is used to determine nesting and the design system 104 will perform analyses to test various rotations of the part. The design system 104 may allow the user to select a "machine default nesting" which uses the machine's average material utilization (determined from process data 120 and factory data 130). The design system 104 may also allow the user to "override" these nestings and instead use a fixed utilization value specified by the user.

The design system 104 performs a number of other analyses to determine the cost and embodied carbon by analyzing the part design (from the CAD model information) as well as the selected material, process, and location. For example, the design system 104 may determine if pilot hole(s) need to be drilled to fabricate a part (as well as the size of those pilot holes). Once the design system 104 performs these (and other) analyses to determine a part's rough mass, the embodied carbon for the scenario is determined by multiplying the determined rough mass by the material's carbon factor (retrieved from material data 140). In this manner, embodiments account for all of the processes associated with creating the stock material resulting in an accurate determination of a part's embodied carbon. The rough mass is used by the design system 104 to determine a "material embodied carbon" of the part.

The design system 104 also performs a number of determinations to estimate the cycle time associated with the manufacture of a part in a given scenario. The cycle time for manufacturing a part varies by the process group selected in a scenario. For example, a part that is to be manufactured using a machining process may involve a number of cycle times that comprise the overall cycle time. A machining process may include a cut time (where the material is cut to a shape or size). The cutting part of the cycle time may have multiple steps, each of which includes an engagement time and a rapid movement time. The engagement time is the time during which a tool or part is spinning (or otherwise operating). The rapid movement time is the time during which the tool or part is being positioned (while neither the tool nor the part is spinning). Each of these involves complex calculations and data retrieved from the process data 120 and factory data 130 as well as a number of rules based on a selected process and routing. For machining processes, the engagement time is comprised of "chipmaking time" and "non-chipmaking time". Each of these times are dependent on the specific process and machine used and may be determined by the design system 104 (with reference to data from process data 120 and factory data 130). Once the overall cycle time has been calculated for a given scenario, embodiments utilize factory data 130 to compute an electricity carbon factor for the scenario. The electricity carbon factor may be expressed in kg $CO_2e/kWh$ and is generally dependent on the cycle time, the machine data, and the factory location (which has an associated "grid mix"). As discussed above, the factory location may be a virtual model of a factory in a geographic location. The virtual model may include energy data defining the grid mix associated with that location. Once the manufacturing (or "process") embodied carbon of manufacturing a part has been determined, a total embodied carbon estimate may be determined (by summing the material embodied carbon, the process embodied carbon and any logistics embodied carbon associated with the scenario). In some embodiments, the logistics embodied carbon associated with a scenario may be a user defined value. For example, a user may have an understanding of their logistics embodied carbon and may enter that value. As a default, a value of zero may be provided.

The design system 104 also operates to calculate the cost of a scenario, including a determination of the material costs, labor costs and tooling costs (with reference to costing rules and data from process data 120, factory data 130 and material data 140).

Processing continues at 214 where the design system 104 presents results of the analysis to the user (e.g., in the form of a user interface, spreadsheets, or the like). As an example, the user may be presented with a user interface via a display 300 as shown in FIG. 3C, where the results of an analysis for a given scenario are shown. In the display 300 of FIG. 3C, the user is presented with a spreadsheet style display of data showing the results of the analysis for one scenario. The data in FIG. 3C shows an analysis of the heat sink, where the die cast part required four processing steps in the selected routing (melting, high pressure die casting, trimming, and milling). The analyzed scenario selected a Chinese factory. The design system 104 determined that the scenario would have a total embodied carbon (measured in kg $CO_2e$) of 0.63, consisting of 0.52 of material embodied carbon, 0.11 of process embodied carbon and 0.00 of logistics embodied carbon to produce each heat sink. Further, the design system 104 determined that the scenario would have a fully burdened cost of $1.77 (USD) per manufactured heat sink. In some embodiments, the user may be able to view and/or download a detailed breakdown of the cost data showing, for example, the manufacturing time(s) for each process and detailed breakdowns of the cost data. In some embodiments, the user may select the scenario presented at 214 as the final scenario for use in production. In some embodiments, the user may interact with the design system 104 to cause the specifications of the selected scenario to be transmitted to a manufacturer for use in producing the part in accordance with the scenario. In some embodiments, the specifications of the selected scenario may be transmitted to a user device 102 associated with a manufacturer.

Pursuant to some embodiments, a user may wish to compare the results of multiple scenarios to select a scenario that has a desired balance of low embodied carbon and low cost. Referring to FIG. 2B, a process 250 is shown which depicts an analysis sequence that may be used to analyze different part manufacture scenarios. The process 250 may be performed by a user operating a user device 102 to interact with the design system 104. At 252, the user performs an initial analysis of a part (e.g., by following the process 200 of FIG. 2A). At 254, the user stores the initial scenario results for the part. The design system 104 stores the scenario results for later retrieval and analysis. The user may then provide information at 256 to modify one or more variables in the scenario to create a new scenario. For example, the user may choose a different process group, a different factory location, a different process routing, a different material, or a different production volume or batch size. Processing continues at 258 where the design system 104 stores the updated scenario results for later retrieval and analysis. Processing at 256 and 258 may be repeated as desired by the user to provide different combinations of variables for analysis.

Processing continues at 260 where design system 104 displays a comparison of the various scenarios for the manufacture of the part to the user. As discussed above, each scenario may be saved by a user, and each scenario may involve a selection of one or more different input variables (e.g., the user can modify the process group, factory location, material selection, etc.). Embodiments allow the results of each of these different scenarios to be viewed by a user. For example, referring to FIG. 3H, processing at 260 may involve the design system 104 presenting a display 300 to a user in chart form, showing the results of each scenario. The display 300 may include an area 390 which lists the different scenarios run for a selected part as well as an area 392 which displays results for each scenario. In the display 300 of FIG. 3H, the user may click on, hover over using a cursor, or otherwise select a specific scenario in the list of scenarios 390 to view further details about that scenario (for example, hovering over a scenario may cause a modal or window to overlay a portion of the display 300 showing the variables selected in each scenario). In the area 392, the user may select output data to graph for each scenario. For example, the user may select to display the fully burdened cost data and total embodied carbon for each scenario. Different cost options may also include material cost, labor cost, fixture cost, etc. Different embodied carbon options may include total embodied carbon, material embodied carbon, process embodied carbon, logistics embodied carbon, etc. In the illustrative example, the user may determine that scenario 3 achieves the user's desired balance of low cost and relatively low embodied carbon. By presenting the user with such a display comparing scenarios, embodiments allow users to efficiently compare highly complex scenarios. The user may interact with the results to determine which scenario produces the desired results (e.g., by balancing the embodied carbon of each scenario with the cost of each scenario, the user is better able to select a scenario that matches a desired outcome). In some embodiments, the user may interact with the design system 104 to select one of the scenarios as the final scenario for use in manufacturing a part. In some embodiments, the design system 104 may transmit the scenario to a manufacturer to control the manufacture of the part in accordance with the selected scenario.

Pursuant to some embodiments, the design system 104 may be configured to automatically analyze data input by a user to ensure that the user has selected, or is only permitted to select, a valid combination of materials, processes and factory locations. Further, the design system 104 may be configured to automatically suggest alternative materials, processes or factory locations that may result in either reduced cost or reduced embodied carbon. For example, referring to FIG. 2C, in some embodiments, a process 280 may be performed after a user has run a scenario involving a particular selection of material. The design system 104 performs processing to analyze the material selection (and other selected attributes) at 282. At 284, the design system 104 determines whether or not one or more alternative materials are available (e.g., materials that are compatible with the part design). At 286, the design system 104 causes a user interface to be presented to the user listing the alternative(s). For example, referring again to FIG. 3E, the user interface presenting the alternative(s) may be navigated to by the user from item 375 (the user interface area that shows the material carbon effect relative to one or more alternatives). If the user wishes to analyze the alternative(s) in more detail, the user may click on the area (or on a button) associated with item 375 and may be presented with a user interface 300 shown in FIG. 3I. As shown in FIG. 3I, the user interface lists one or more alternative materials that have different carbon emissions and cost in an area 380. The user may be shown the material that was analyzed in the current scenario and a list of potential alternative materials. The user may select option 382 to analyze one or more of the alternative materials which will cause the design system 104 to perform an analysis using the previously entered criteria as well as the newly selected material.

Referring again to FIG. 2C, if the user selects one or more alternatives at 288, processing continues at 290 where the alternative scenario(s) are run using the selected alternative material(s). In this manner, embodiments allow a user to easily generate and compare multiple scenarios using materials (or other inputs) that may result in different cost or carbon effects. While example user interfaces were shown in which alternative materials were automatically identified by the design system 104, the system may also automatically identify other alternatives (such as factory location, process groups, etc.). In this manner, embodiments allow highly complex comparisons of scenarios involving highly complex analyses with multiple variables to easily be reviewed by a user so that a selection of a scenario can be made that achieves a desired balance of carbon effect and cost.

Figure 3D:
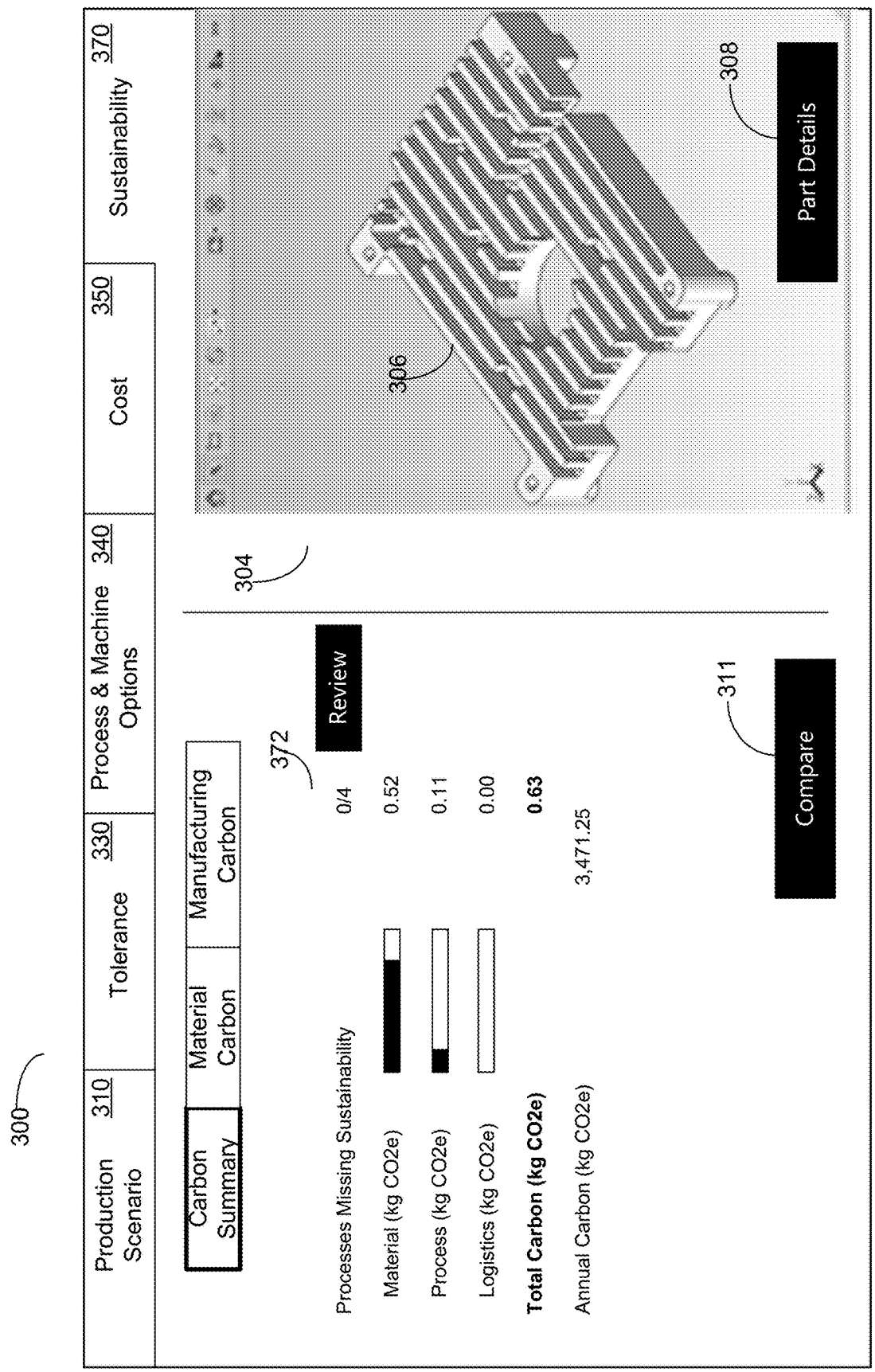
Figure 3E:
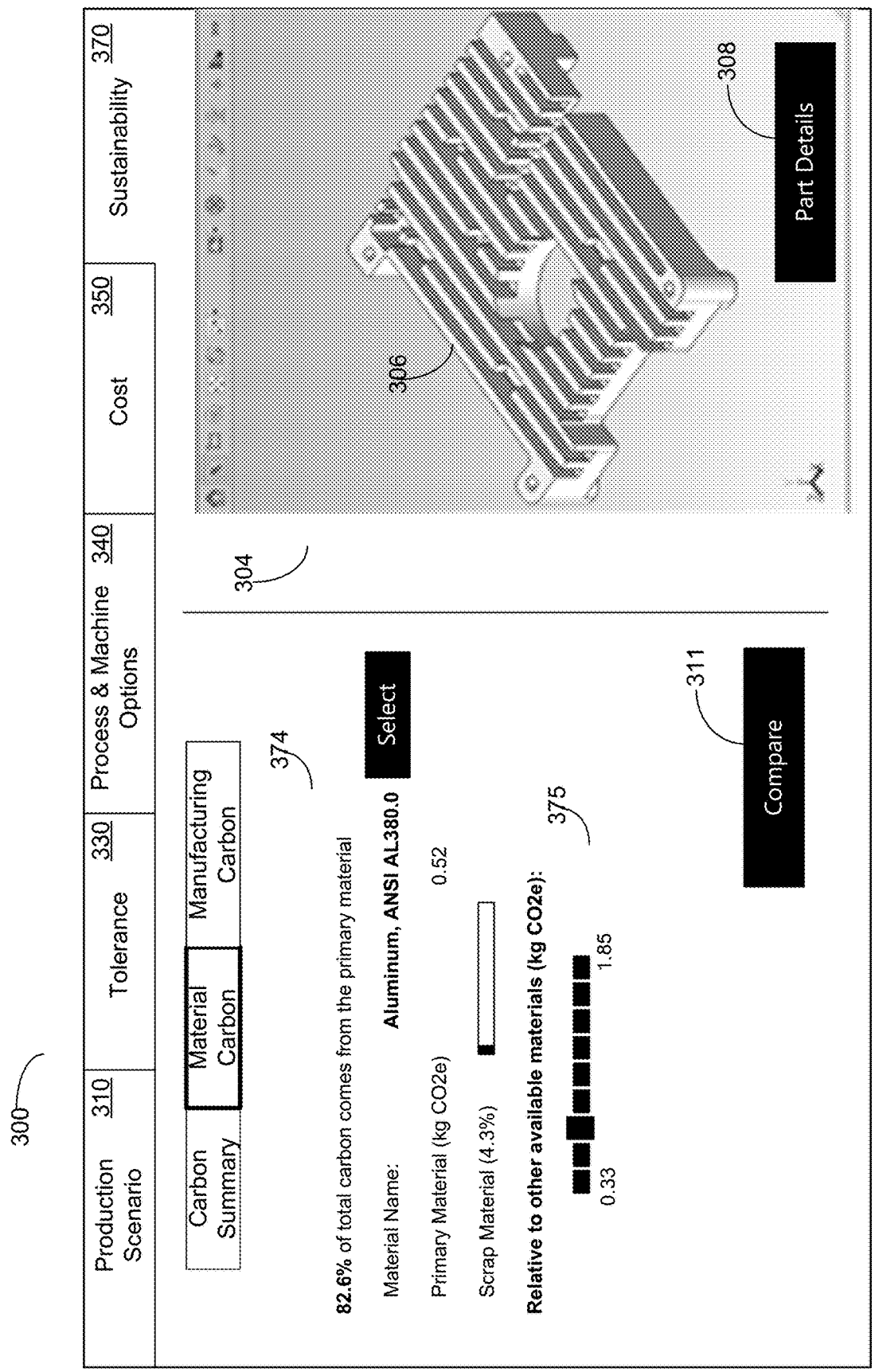
Figure 3F:
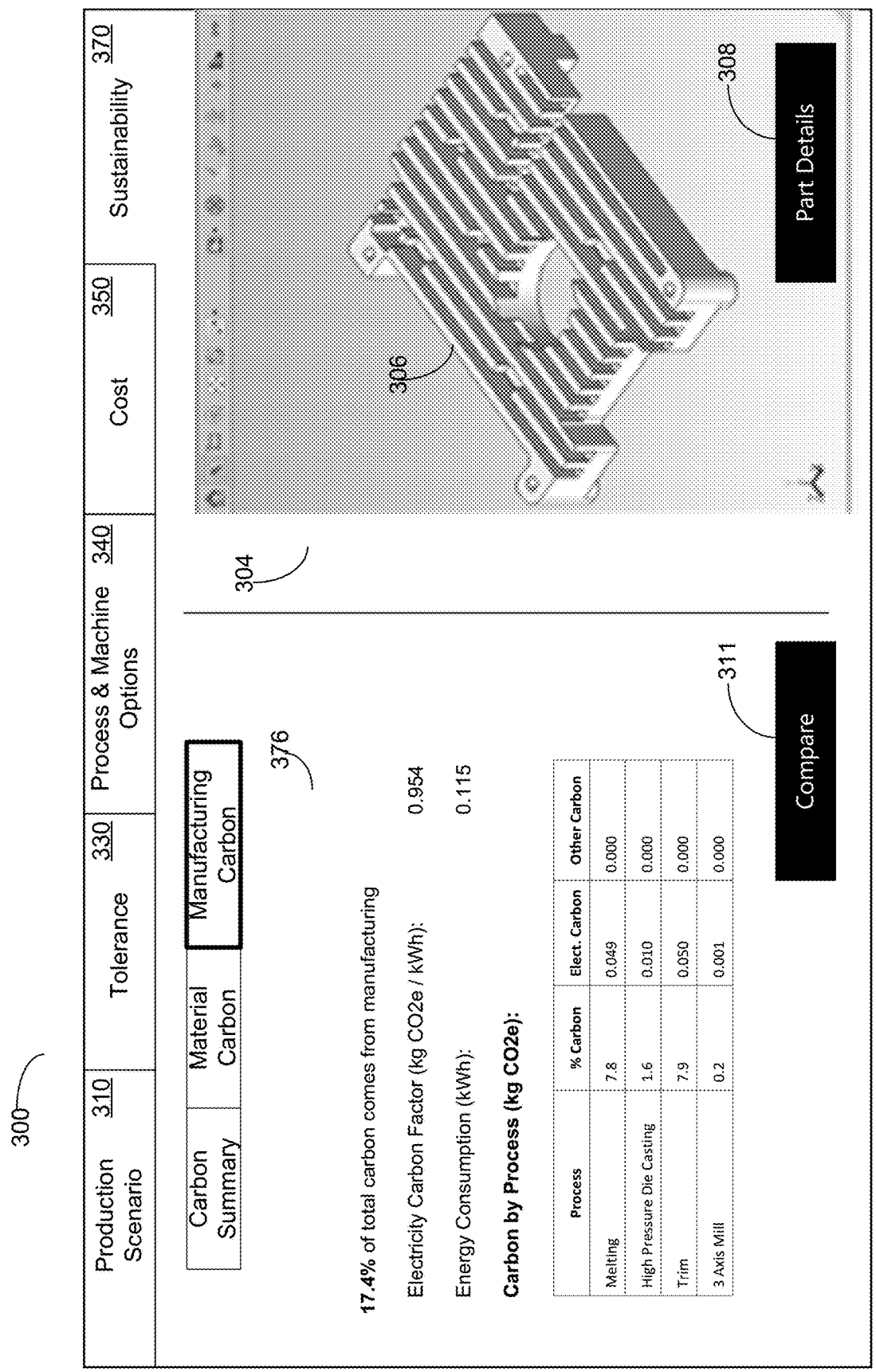
Figure 3G:
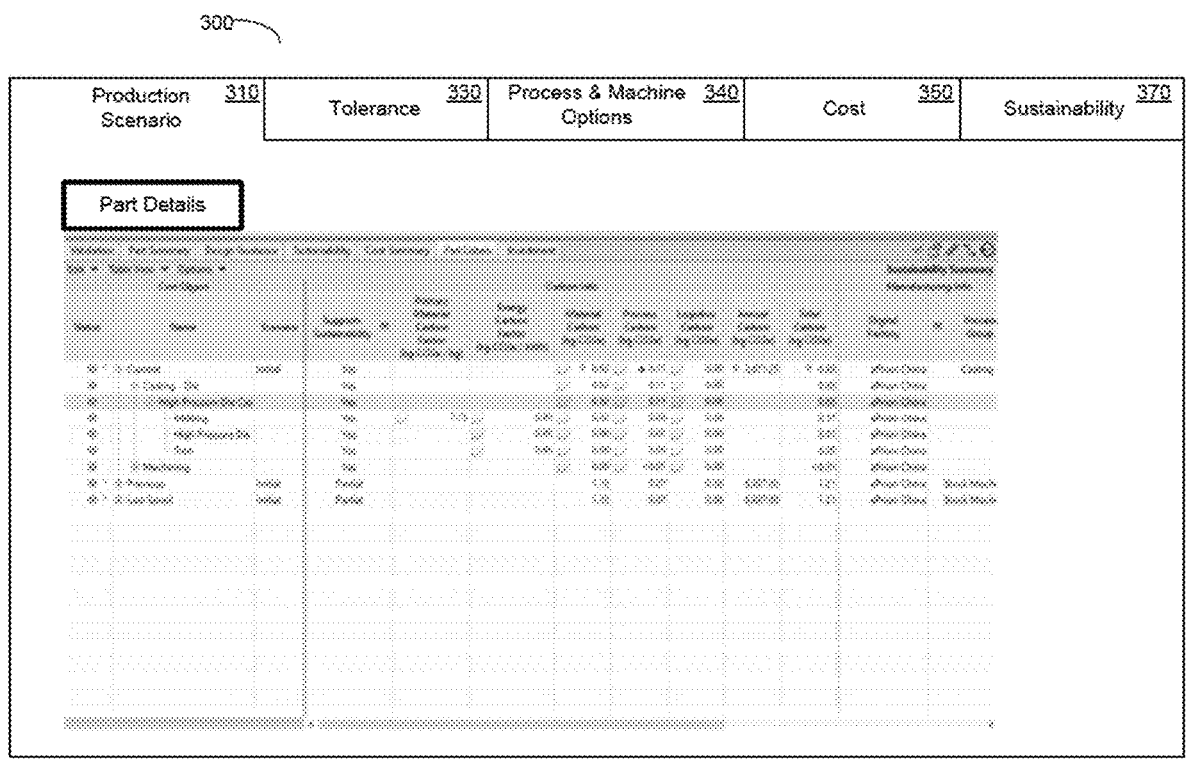
Figure 3H:
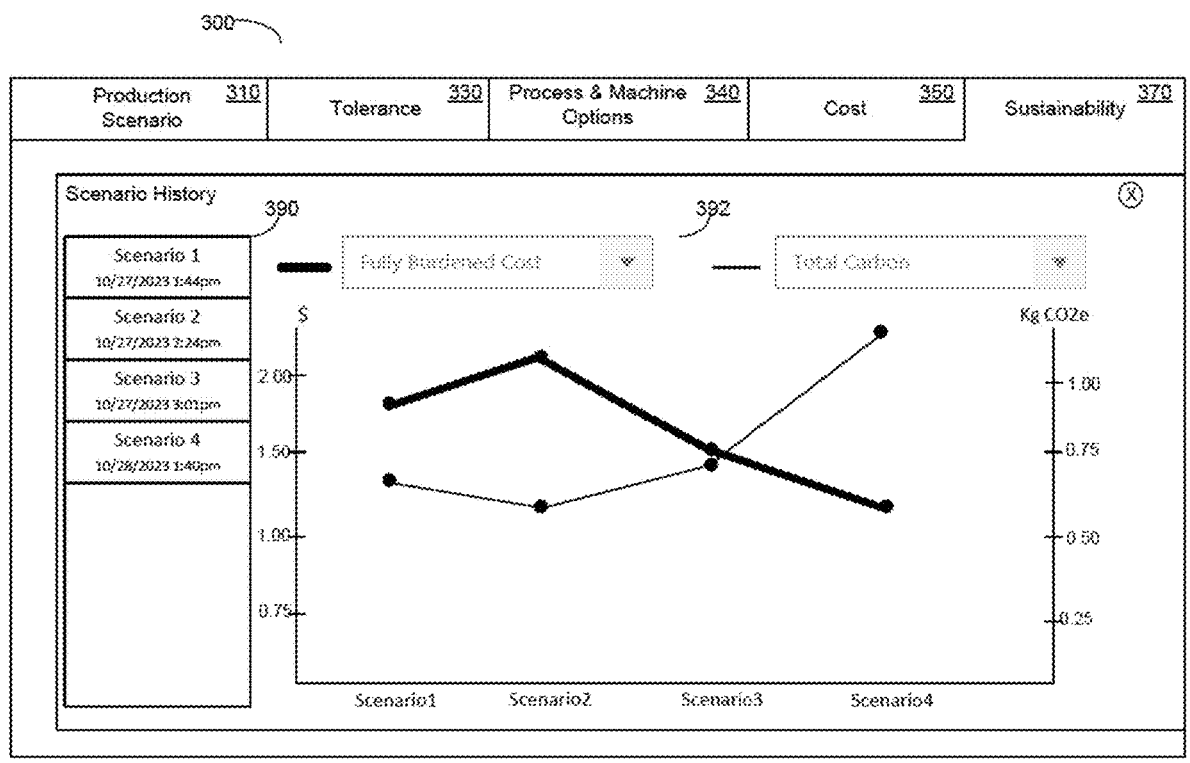

Pursuant to some embodiments, a user may be provided with a number of options and interfaces while creating or evaluating a scenario. For example, referring again to FIG. 3B, the user may be presented with an option 309 to save the current scenario. Further, the user may be presented with an option 308 to view part details. An illustrative user interface that may be displayed to a user who selects to view part details is shown in FIG. 3G. In the display 300 of FIG. 3G, a user is presented with a tabular view of the process routings associated with the selected process group for the part. Continuing the illustrative example, the process routings shown are for the die casting process for the heat sink in the Chinese digital factory. As shown, the die casting routing for this part in this scenario includes four processes: melting, high pressure die casting, trimming, and 3 Axis Milling. The display 300 of FIG. 3G shows embodied carbon information associated with each of these process steps.

A user may also be able to view cost information for the current scenario. For example, referring to FIG. 3C, a display 300 is shown which may be displayed to a user who has selected the cost menu item 350. The user may also be able to view sustainability information for the current scenario. For example, referring to FIG. 3D, a display 300 is shown which may be displayed to a user who has selected the sustainability menu item 370. In some embodiments, the sustainability menu item 370 may be presented as a single display or may be broken into multiple displays (as shown in FIGS. 3D-3F). In the display 300 of FIG. 3D, the user is shown a sustainability screen displaying a embodied carbon summary 372 of the current scenario (with information noting how many of the evaluated processes are missing sustainability information, as well as information indicating the computed embodied carbon). A user may select option 311 to compare the current scenario with other scenarios.

Referring to FIG. 3E, a user who has selected to view the material embodied carbon information may be presented with a display 300 that shows the material embodied carbon 374 of the current scenario. Referring to FIG. 3F, a user who has selected to view the manufacturing embodied carbon information may be presented with a display 300 that shows the manufacturing embodied carbon 376 of the current scenario. As shown, a table may also be presented showing the manufacturing embodied carbon of each process in the routing. In the illustrative example, the melting process and the trim process account for the majority of the manufacturing process embodied carbon. Those skilled in the art, upon reading this disclosure, will appreciate that other displays, interfaces and analyses may be provided to users.

Figure 4:
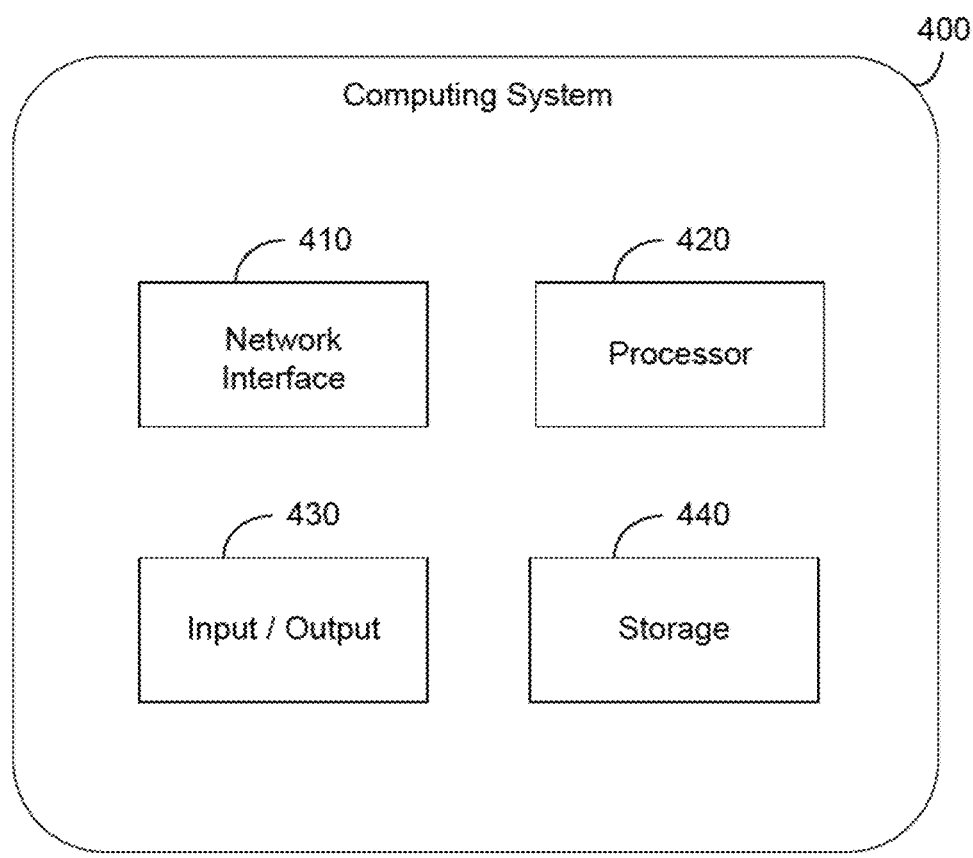
FIG. 4 is a diagram illustrating components of a design system pursuant to some embodiments.

FIG. 4 illustrates a computing system 400 that can be configured to function as the design system 104 of FIG. 1, in accordance with an example embodiment. For example, the computing system 400 may be a database node, a server, a cloud platform, a user device, or the like. In some embodiments, the computing system 400 may be distributed across multiple devices. Referring to FIG. 4, the computing system 400 includes a network interface 410, a processor 420, an output 430, and a storage device 440 such as an in-memory. Although not shown in FIG. 4, the computing system 400 may also include or be electronically connected to other components such as a display, an input unit, a receiver, a transmitter, a persistent disk, and the like. The processor 420 may control the other components of the computing system 400.

The network interface 410 may transmit and receive data over a network such as the Internet, a private network, a public network, an enterprise network, and the like. The network interface 410 may be a wireless interface, a wired interface, or a combination thereof. The processor 420 may include one or more processing devices each including one or more processing cores. In some examples, the processor 420 is a multicore processor or a plurality of multicore processors. Also, the processor 420 may be fixed or it may be reconfigurable.

The output 430 may output data to an embedded display of the computing system 400, an externally connected display, a display connected to a cloud platform, another computing device (such as, for example, a display used in conjunction with a user device 102 and/or a display used in conjunction with a design data source 110), and the like. For example, the output 430 may include a port, an interface, a cable, a wire, a board, and/or the like, with input/output capabilities. The network interface 410, the output 430, or a combination thereof, may interact with applications executing on other devices. The storage device 440 is not limited to a particular storage device and may include any known memory device such as RAM, ROM, hard disk, and the like, and may or may not be included within the cloud environment. The storage 440 may store software modules or other instructions which can be executed by the processor 420 to perform the methods 200, 250, 280 shown in FIG. 2.

According to various embodiments, the processor 420 may receive an image including a geometric design of a part. The image may include a technical model such as CAD, or the like. The processor 420 may be configured to analyze the technical model to perform processing as described herein. Furthermore, the output 430 may output, to a user interface, information about the embodied carbon of different approaches to manufacture the part.

As will be appreciated based on the foregoing specification, the above-described examples of the disclosure may be implemented using computer programming or engineering techniques including computer software, firmware, hardware or any combination or subset thereof. Any such resulting program, having computer-readable code, may be embodied or provided within one or more non transitory computer-readable media, thereby making a computer program product, i.e., an article of manufacture, according to the discussed examples of the disclosure. For example, the non-transitory computer-readable media may be, but is not limited to, a fixed drive, diskette, optical disk, magnetic tape, flash memory, external drive, semiconductor memory such as read-only memory (ROM), random-access memory (RAM), and/or any other non-transitory transmitting and/or receiving medium such as the Internet, cloud storage, the Internet of Things (IoT), or other communication network or link. The article of manufacture containing the computer code may be made and/or used by executing the code directly from one medium, by copying the code from one medium to another medium, or by transmitting the code over a network.

The computer programs (also referred to as programs, software, software applications, "apps", or code) may include machine instructions for a programmable processor, and may be implemented in a high-level procedural and/or object-oriented programming language, and/or in assembly/machine language. As used herein, the terms "machine-readable medium" and "computer-readable medium" refer to any computer program product, apparatus, cloud storage, internet of things, and/or device (e.g., magnetic discs, optical disks, memory, programmable logic devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal that may be used to provide machine instructions and/or any other kind of data to a programmable processor.

The above descriptions and illustrations of processes herein should not be considered to imply a fixed order for performing the process steps. Rather, the process steps may be performed in any order that is practicable, including simultaneous performance of at least some steps. Although the disclosure has been described in connection with specific examples, it should be understood that various changes, substitutions, and alterations apparent to those skilled in the art can be made to the disclosed embodiments without departing from the spirit and scope of the disclosure as set forth in the appended claims.

What is claimed is:

1. A computing system comprising:
 a communication port coupled to the computing system to facilitate a transmission of data with a remote user device via an API (application programming interface); and
 a processor configured to:
  receive, from a user device via the API, one or more computer aided design (CAD) files including information representing a CAD model of at least a first part and a request to perform an analysis of at least the first part described by the CAD model, the at least one CAD file including a structural design and a specification of attributes of at least the first part;
  determine, automatically based on information in the one or more CAD files, at least one process group compatible with the structural design of the at least the first part;
  receive an indication of a user selection of one or more of the determined at least one process group;
  receive information identifying a manufacturing scenario, the manufacturing scenario including the user selected one or more of the determined at least one process group, a factory location and a material, each process group in the user selected one or more of the determined at least one process group including one or more manufacturing processes to manufacture at least the first part;
  determine, based on the information identifying the manufacturing scenario, an embodied carbon of the manufacturing scenario, the embodied carbon including a material embodied carbon, a process embodied carbon, and a total process embodied carbon;
  present, to a user, information associated with the information identifying the manufacturing scenario including the identified manufacturing scenario and the embodied carbon determined for the identified manufacturing scenario; and
  receive an indication of a user selection of the identified manufacturing scenario from the presented information associated with the information identifying the manufacturing scenario;
  transmit, via a network interface in response to the user selection of the identified manufacturing scenario, specifications of the identified manufacturing scenario to a user device associated with a manufacturer to produce at least the first part in accordance with the identified manufacturing scenario, including the material embodied carbon, the process embodied carbon, and the total process embodied carbon determined for the identified manufacturing scenario.

2. The computing system of claim 1, wherein the processor is further configured to
 store the information associated with the embodied carbon of the manufacturing scenario.

3. The computing system of claim 2, wherein the processor is further configured to:
 receive information identifying a second manufacturing scenario associated with at least the first part, the second manufacturing scenario including information updating a value of at least one of (i) the selected process group, (ii) the selected factory location and (iii) the selected material;
 determine, based on the information identifying the second manufacturing scenario, a second embodied carbon of the manufacturing scenario, the second embodied carbon including a second material embodied carbon, a second process embodied carbon and a second total process embodied carbon; and
 present information associated with the second embodied carbon of the second manufacturing scenario to a user.

4. The computing system of claim 3, wherein the processor is further configured to store the information associated with the second embodied carbon of the second manufacturing scenario.

5. The computing system of claim 1, wherein the processor is further configured to determine, based on the information identifying the manufacturing scenario, an estimated cost to produce the at least first part using the manufacturing scenario.

6. The computing system of claim 4, wherein the processor is further configured to generate, for display to a user device, an interface comparing the embodied carbon of the manufacturing scenario and the second manufacturing scenario.

7. The computing system of claim 1, wherein the processor is further configured to:
   automatically determine, based on the information identifying the manufacturing scenario, at least a first alternative material compatible with at least the first part; and
   generate, for display to a user device, an interface presenting information associated with the at least first alternative material.

8. The computing system of claim 7, wherein the processor is further configured to receive, from the user, a selection of the at least first alternative material and a request to create a further manufacturing scenario, the further manufacturing scenario including the selected process group, the selected factory location and the at least first alternative material.

9. The computing system of claim 8, wherein the processor is further configured to generate, for display to a user operating a user device, an interface comparing the embodied carbon of the manufacturing scenario and the further manufacturing scenario.

10. A method for operating a design system, comprising:
   receiving, from a user device via an API (application programming interface), one or more computer aided design (CAD) files including information representing a CAD model of at least a first part, the at least one CAD file describing a structural design and a specification of attributes of at least the first part;
   receiving, via the API, a request to perform an analysis of at least the first part;
   determining, based on information in the one or more CAD files, at least one process group compatible with the structural design of the at least the first part;
   receiving an indication of a user selection of one or more of the determined at least one process group;
   receiving information identifying a manufacturing scenario, the manufacturing scenario including the user selected one or more of the determined at least one process group, a selected factory location and a selected material each process group in the user selected one or more of the determined at least one process group including one or more manufacturing processes to manufacture at least the first part;
   determining, automatically based on the information identifying the manufacturing scenario, an embodied carbon of the manufacturing scenario, the embodied carbon including a material embodied carbon, a process embodied carbon and a total process embodied carbon;
   presenting, to a user, information associated with the information identifying the manufacturing scenario including the identified manufacturing scenario and the embodied carbon determined for the identified manufacturing scenario;
   receiving an indication of a user selection of the identified manufacturing scenario from the presented information associated with the information identifying the manufacturing scenario; and
   transmitting, via network interface in response to the user selection of the identified manufacturing scenario, specifications of the identified manufacturing scenario of the presented information to a user device associated with a manufacturer to produce at least the first part in accordance with the identified manufacturing scenario, including the material embodied carbon, the process embodied carbon, and the total process embodied carbon determined for the identified manufacturing scenario.

11. The method of claim 10, further comprising storing the information associated with the embodied carbon of the manufacturing scenario.

12. The method of claim 11, further comprising:
   receiving information identifying a second manufacturing scenario associated with at least the first part, the second manufacturing scenario including information updating a value of at least one of (i) the selected process group, (ii) the selected factory location, and (iii) the selected material;
   determining, based on the information identifying the second manufacturing scenario, a second embodied carbon of the manufacturing scenario, the second embodied carbon including a second material embodied carbon, a second process embodied carbon and a second total process embodied carbon; and
   causing information associated with the second embodied carbon of the second manufacturing scenario to be displayed to a user.

13. The method of claim 12, further comprising storing the information associated with the second embodied carbon of the second manufacturing scenario.

14. The method of claim 10, further comprising determining, based on the information identifying the manufacturing scenario, an estimated cost to produce the part using the scenario.

15. The method of claim 13, further comprising generating, for display to the user, an interface comparing the embodied carbon of the manufacturing scenario and the embodied carbon of the second manufacturing scenario.

16. The method of claim 10, further comprising:
   automatically determining, based on the information identifying the manufacturing scenario, at least a first alternative material compatible with at least the first part; and
   generating, for display to a user device, an interface presenting information associated with the at least first alternative material.

17. The method of claim 16, further comprising receiving, from the user, a selection of the at least first alternative material and a request to create a further manufacturing scenario, the further manufacturing scenario including the selected process group, the factory location and the at least first alternative material.

18. The method of claim 17, further comprising generating, for display to a user device, an interface comparing the embodied carbon of the manufacturing scenario and the further manufacturing scenario.

* * * * *